United States Patent [19]
Hassan et al.
[11] 3,874,525
[45] Apr. 1, 1975

[54] METHOD AND APPARATUS FOR HANDLING WORKPIECES

[75] Inventors: Javathu K. Hassan, Hopewell Junction; Alfred Mack; Michael R. Wojtaszek, both of Poughkeepsie, all of N.Y.

[73] Assignee: International Business Machines Corporation, Armonk, N.Y.

[22] Filed: June 29, 1973

[21] Appl. No.: 375,279

[52] U.S. Cl. ............... 214/17 B, 118/49, 214/1 BC, 214/152

[51] Int. Cl. ............................................ B65g 65/30

[58] Field of Search ................ 214/1 BC, 17 B, 152; 118/49, 49.1, 49.5; 34/242

[56] References Cited

UNITED STATES PATENTS

| | | | |
|---|---|---|---|
| 2,094,753 | 10/1937 | Ryan et al. | 214/17 B X |
| 2,938,804 | 5/1960 | Gordon et al. | 214/17 B X |
| 3,521,765 | 7/1970 | Kauffman et al. | 118/49 X |
| 3,541,921 | 11/1970 | Helfer et al. | 214/1 BC X |

*Primary Examiner*—Robert J. Spar
*Assistant Examiner*—Leslie J. Paperner
*Attorney, Agent, or Firm*—Frank C. Leach, Jr.; Theodore E. Galanthay

[57] ABSTRACT

A semiconductor wafer, which has chips formed thereon, is moved from a class 100 environment into a vacuum chamber in which pattern writing is performed on the chips by an electron beam without significantly affecting the vacuum level in the vacuum chamber. The wafer is initially disposed on an elevator, which is within the vacuum chamber, through an opening, which is vacuum sealed by the elevator at this time, in the top wall of the vacuum chamber. A lid is then placed over the opening from the exterior to cooperate with the elevator to form an ante chamber with the wafer disposed therein. The ante chamber, which is purged prior to the lid being placed over the opening, is then reduced to a vacuum of $5 \times 10^{-2}$ torr. The elevator then lowers the wafer into a horizontal plane in which a transfer mechanism is located to transfer the wafer from the elevator to an X-Y table on which the wafer is mounted for pattern writing of the chips. The transfer mechanism includes an arm, which is indexed 180° during each activation of an indexing means connected thereto, and gripping means at each end of the arm to simultaneously grasp and release wafers on the elevator and the X-Y table to interchange the wafers between the elevator and the table.

36 Claims, 17 Drawing Figures

METHOD AND APPARATUS FOR HANDLING WORKPIECES

One means of pattern writing chips on a semiconductor wafer is to use an electron beam. This requires a very high vacuum such as $3 \times 10^{-6}$ torr, for example.

While pattern writing by an electron beam produces precise patterns on the chips, the time for loading and unloading the wafers into the vacuum chamber in which the beam is applied has required a substantial period of time if this is to be accomplished without disturbing the vacuum level within the vacuum chamber to any significant extent. Thus, it has been necessary to introduce the wafer into the vacuum chamber from the atmosphere and then remove it therefrom with safeguards to prevent lowering of the vacuum level. Previously available systems have taken a substantial period of time for these functions whereby the cost of processing for pattern writing chips on a wafer has been relatively high.

One system for introducing a wafer into a vacuum chamber in which an electron beam is applied to the chips on the semiconductor wafer has utilized a single auxiliary chamber having a first valve controlling communication of the auxiliary chamber with a main vacuum chamber and a second valve controlling communication of the auxiliary chamber with the atmosphere. The auxiliary chamber also has contained a transfer mechanism to move the wafer from the vacuum chamber into the auxiliary chamber and from the auxiliary chamber into the atmosphere and vice versa.

In this system, it also has been necessary to utilize a high vacuum pumping system to reduce the pressure in the auxiliary chamber to the vacuum level within the main chamber after the auxiliary chamber has received a wafer from the atmosphere for pattern writing. Thus, in addition to the substantial period of time for dropping the auxiliary chamber to atmospheric pressure, opening the second valve, activating the transfer mechanism to move the wafer into the auxiliary chamber, and closing the second valve, a further substantial period of time is required to reduce the vacuum level in the auxiliary chamber to that within the main chamber because of the volume of the auxiliary chamber relative to the volume of the main chamber.

When the substantial equalization of the vacuum levels within the auxiliary chamber and the main chamber has occurred so that there is no substantial effect on the vacuum level in the main chamber when the main chamber communicates with the auxiliary chamber, the first valve is opened, and the transfer mechanism moves the wafer into the main chamber. Then, the first valve is closed.

After pattern writing of the chips on the wafer has been completed, it is necessary to open the first valve and then activate the transfer mechanism to move the wafer from the main chamber into the auxiliary chamber. Next, the first valve is closed, and the auxiliary chamber is now brought up to substantially atmospheric pressure. Then, the second valve is opened to allow the removal of the processed wafer from the auxiliary chamber to the atmosphere by the transfer mechanism and to enable a new wafer to be introduced into the auxiliary chamber by the transfer mechanism. Then, the second valve is again closed, and the process repeated with pumping down of the auxiliary chamber. This is a very slow sequential process that is not desirable.

Another system has utilized an unload auxiliary chamber on one side of the main vacuum chamber and a load auxiliary chamber on the other side of the main chamber. The unload chamber has a first valve controlling communication of the unload chamber with the atmosphere and a second valve controlling communication of the unload chamber with the main chamber. The load chamber has similar first and second valves. Furthermore, each of the unload and load chambers has a separate transfer mechanism therein, and each chamber has its own vacuum pump.

In this system, the load chamber must be at atmosphere to receive a new wafer through opening its first valve. After the transfer mechanism has disposed the wafer in the load chamber, the first valve is closed. Then, the load chamber is pumped down to substantially the vacuum level within the main chamber. The second valve of the load chamber is opened to enable the transfer mechanism to deposit the wafer on the X-Y table within the main chamber. Next, the second valve of the load chamber is closed.

After pattern writing of the chips on the wafer has been completed, the unload chamber, which was pumped down to substantially the vacuum level in the main chamber by its pump at the same time as the load chamber, has its second valve opened, and the transfer mechanism in the unload chamber moves the processed wafer from the main chamber into the unload chamber. Then, the second valve of the unload chamber is closed.

Next, both the load and unload chambers have bleed valves to supply atmospheric pressure thereto. Upon atmospheric pressure being reached, the unload chamber has its first valve opened to allow removal of the processed wafer therefrom to the atmosphere by its transfer mechanism, and the load chamber has its first valve opened to receive a new wafer from the atmosphere through its transfer mechanism.

After the processed wafer has been removed from the unload chamber and the new wafer added to the load chamber, their first valves are closed. Then, both the load and unload chambers are pumped down to the vacuum level within the main chamber by their pumps. The process is then repeated of transferring the new wafer into the main chamber through opening the second valve of the load chamber.

This system of two auxiliary chambers reduces the time required to load and unload the wafers in comparison with the single auxiliary chamber arrangement. However, it requires two complete and separate auxiliary pumping systems and complex control functions. Thus, while the system with two auxiliary chambers decreases the time for pattern writing the chips on one of the wafers in comparison with the single auxiliary chamber system, the time period for handling the wafer takes approximately 6 minutes without any time for vibration settling. No pattern writing by the electron beam can take place until all vibrations have been reduced to an acceptable level; this includes the vibrations created by the transfer mechanisms and by the pumps.

The present invention satisfactorily solves the foregoing problems by providing a system in which the time for loading and unloading semiconductor wafers into and out of a vacuum chamber is insignificant in comparison with the time for pattern writing of the chips on the wafer. Thus, with the present system, the transfer mechanism can accomplish all of the loading and unloading functions in approximately 15 seconds whereas pattern writing requires approximately 3 minutes. Accordingly, when using the present invention, the time for processing a wafer is governed by the pattern writing time rather than the wafer unloading and loading time.

Therefore, in comparison with the previously available systems for loading and unloading semiconductor wafers for pattern writing by an electron beam, the present invention reduces the load and unload time to approximately one-twentieth of the time previously required by the two auxiliary chamber system. Furthermore, the entire process for both handling and pattern writing a semiconductor wafer is reduced to approximately one-third of the time previously required by the two auxiliary chamber system.

The present invention accomplishes this time reduction through utilizing a virtual ante chamber, which is formed by movable elements within the exterior of the vacuum chamber. By using a relatively small ante chamber in comparison with the vacuum chamber (the ante chamber preferably has a volume of approximately one one-hundredth of the vacuum chamber), it is not necessary to have the same vacuum level as exists within the vacuum chamber since the vacuum in the relatively small ante chamber will not significantly affect the vacuum level in the vacuum chamber when communicating therewith. Because of the relatively small volume and the lesser vacuum level, the time for pumping down the ante chamber to a partial vacuum, which is significantly higher than the pressure in the vacuum chamber, is decreased.

The ante chamber communicates with the vacuum chamber after pump down of the ante chamber merely through lowering an elevator, which is within the vacuum chamber and supports the wafer, into the vacuum chamber. During the time that the wafer is being transferred from the elevator to the X-Y table, a processed wafer also is being transferred from the X-Y table to the elevator. All movements of the transfer mechanism occur simultaneously in opposite directions to decrease the vibrations created by the transfer mechanism. Furthermore, during the transfer of the wafers by the transfer mechanism from the elevator to the X-Y table and vice versa, any vibrations created by the elevator have decreased to an acceptable level before the X-Y table is at its writing position.

Thus, the present invention utilizes the advantage of the elevator functioning as both a valve between the ante chamber and the vacuum chamber and as the transfer mechanism from the ante chamber to the vacuum chamber. There are not the dual requirements of both opening a valve and then actuating a transfer mechanism and then returning the transfer mechanism to a chamber and closing the valve. There is only the single step of moving the elevator downwardly so that this significantly reduces the time.

The present invention also positions the pumps, motors, and other vibration creating elements exterior of the vacuum chamber. This exterior location also aids in quick repair of any element.

An object of this invention is to provide an apparatus for rapid transfer of a workpiece.

Another object of this invention is to provide a method and apparatus for rapidly moving a workpiece into and out of a vacuum chamber or between two media which are to be separately maintained.

A further object of this invention is to provide an apparatus for introducing a workpiece into a vacuum chamber with significantly affecting the vacuum level therein.

The foregoing and other objects, features, and advantages of the invention will be more apparent from the following more particular description of a preferred embodiment of the invention, as illustrated in the accompanying drawings.

Figure 1:
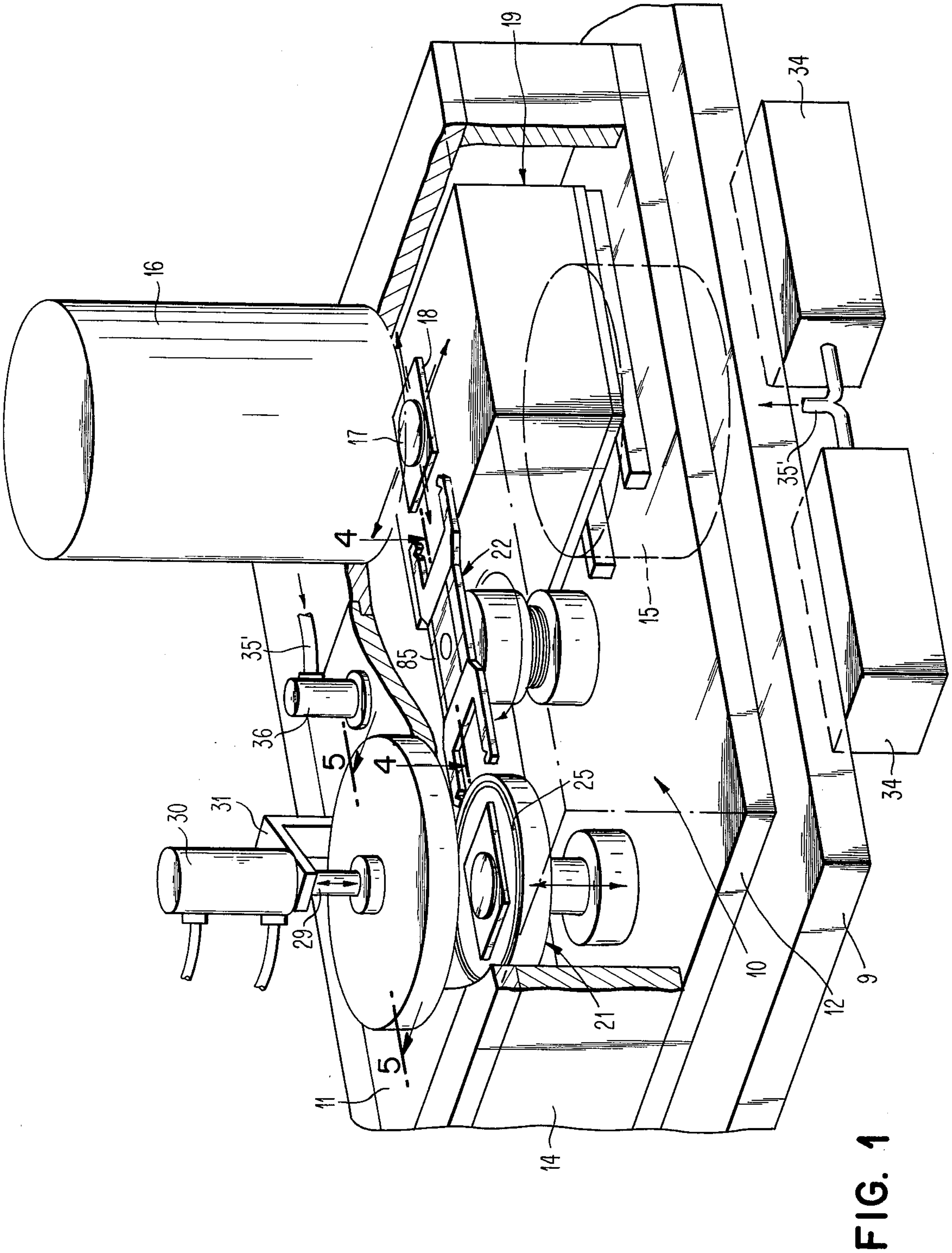
FIG. 1 is a schematic perspective view, partly in section, of a vacuum chamber with which the wafer handling apparatus of the present invention is employed.

Referring to the drawings and particularly FIG. 1, there is shown a vacuum chamber 10, which is supported on a vibration isolation table 9. The vacuum chamber 10 is formed by a top wall 11, a bottom wall 12, and side walls 14. The vacuum chamber 10 is maintained at a desired vacuum by a suitable vacuum pump 15, which is preferably a combination ion pump-/titanium sublimation pump. The combination pump has no moving parts and can be sealed from the vacuum chamber by a valve (not shown) when desired.

The top wall 11 of the vacuum chamber 10 has an optical column 16 supported thereon to control an electron beam, which is applied to a semiconductor wafer 17 to enable pattern writing of chips on the wafer 17. The wafer 17 is supported on a wafer carrier 18, which is disposed on an X-Y table 19 to enable proper positioning of the wafer 17 for pattern writing by the electron beam. The wafer 17 and the wafer carrier 18 may be deemed to be a workpiece.

Each of the wafers 17 is supplied to the vacuum chamber 10 from exterior thereof through a circular opening 20 (see FIGS. 2 and 5) in the top wall 11 of the vacuum chamber 10. The wafer carrier 18 is disposed from the exterior on an elevator 21 (see FIGS. 1, 2 and 5), which is vertically movable to transport the wafer carrier 18 from exterior of the vacuum chamber 10 into the vacuum chamber 10 and dispose of wafer carrier 18 in the same horizontal plane as that in which the wafer carrier 18 is supported on the X-Y table 19. The wafer carrier 18 is transferred from the elevator 21 to the X-Y table 19 and vice versa by a transfer mechanism 22 (see FIG. 1).

The transfer of the wafer carrier 18 with the wafer 17 from exterior of the vacuum chamber 10 to the vacuum chamber 10 and vice versa is accomplished without any significant effect on the vacuum level within the vacuum chamber 10. When the elevator 21 is moved to its uppermost position (see steps 1, 2, 11 and 12 of FIG. 2), an O-ring 25 (see FIG. 5) in the upper surface of a platform 26 engages the bottom surface of the top wall 11 of the vacuum chamber 10 to form a vacuum seal therebetween. Thus, when the O-ring 25 is engaging the bottom surface of the top wall 11 of the vacuum chamber 10, there is no leakage of the vacuum in the vacuum chamber 10 through the opening 20 in the top wall 11 to the exterior. It should be understood that the atmosphere of the exterior is a class 100 environment.

When the O-ring 25 is engaging the bottom surface of the top wall 11 of the vacuum chamber 10, a reduced circular portion 26' of the platform 26 is disposed within the opening 20 with a slight clearance therebetween. This clearance is preferably about one-eighth inch.

Whenever the O-ring 25 is not engaging the bottom surface of the top wall 11 of the vacuum chamber 10, a lid or cover 27 is disposed so that an O-ring 28 in the lower surface of the lid or cover 27 engages the upper surface of the top wall 11 of the vacuum chamber 10 to form a vacuum seal. Thus, the lid or cover 27 prevents communication between the vacuum chamber 10 and the surrounding environment.

The lid 27 has a piston rod 29 of an air cylinder 30 (see FIG. 1) extending upwardly therefrom for connection to a piston within the air cylinder 30, which is supported in spaced relation to the top wall 11 of the vacuum chamber 10 by an L-shaped bracket 31. Accordingly, the lid 27 is movable vertically to permit access to the platform 26 of the elevator 21 to allow one of the wafer carriers 18 to be removed from or delivered to the elevator 21.

The operations of the elevator 21 and the lid 27 are controlled so that the lid 27 is moved away from its sealing engagement with the top wall 11 of the vacuum chamber 10 only when the elevator 21 is in sealing engagement with the top wall 11 of the vacuum chamber 10. The wafer carrier 18 can be removed from the elevator 21 or delivered thereto only during the time when the lid 27 is raised downwardly from the top wall 11 of the vacuum chamber 10 and the elevator 21 is in sealing engagement with the top wall 11 of the vacuum chamber 10.

Furthermore, to enable the transfer of the wafer carrier 18 into and out of the vacuum chamber 10 without having any significant effect on the vacuum level within the vacuum chamber 10, it is necessary that an ante chamber 32 (see steps 2 and 11 of FIG. 2), which is formed between the elevator 21, the lid 27, and the surface of the top wall 11 forming the opening 20, have its pressure controlled. That is, when the elevator 21 is to be moved downwardly to deliver one of the wafer carriers 18 to the vacuum chamber 10, the ante chamber 32 must have a partial vacuum therein related to the vacuum in the vacuum chamber 10 in accordance with the inverse ratio of the volume of the ante chamber 32 to the volume of the vacuum chamber 10. When the lid 27 is to be raised to permit the wafer carrier 18 on the elevator 21 to be removed therefrom to the exterior of the vacuum chamber 10, it is desired that the pressure in the ante chamber 32 be substantially atmospheric.

Accordingly, the top wall 11 of the vacuum chamber 10 has a passage 33 (see FIG. 5) formed therein and can communicate with a vacuum pump 34 (see FIG. 1), which has no moving parts and comprises two separate pumps, with only one used at any time, or a source 35 (see FIG. 5) of dry gaseous nitrogen at about 5 p.s.i. Opening of a valve 36, which is concerned to the vacuum pump 34 by a line 35' (see FIG. 1), connects the vacuum pump 34 to the ante chamber 32 while opening of a valve 36' (see FIG. 5) connects the source 35 of dry gaseous nitrogen with the ante chamber 32.

Thus, when the wafer carrier 18 is to be delivered from the vacuum chamber 10 to the exterior thereof, the source 35 of dry gaseous nitrogen communicates with the ante chamber 32 through opening of the valve 36'. When the wafer carrier 18 is to be delivered to the vacuum chamber 10, the vacuum pump 34 communicates with the ante chamber 32 through opening the valve 36.

Because the volume of the ante chamber 32 is preferably about one one-hundredth of the volume of the vacuum chamber 10, it is not necessary for the ante chamber 32 to have the same vacuum level as that within the vacuum chamber 10. With the vacuum chamber 10 preferably maintained at a vacuum of $3 \times 10^{-6}$ torr pressure, it is only necessary for the ante chamber 32 to have a pressure of $5 \times 10^{-2}$ torr pressure. When this vacuum level is reached within the ante chamber 32, the elevator 21 can be lowered to enable the ante chamber 32 to communicate with the vacuum chamber 10 without the vacuum level in the vacuum chamber 10 being affected by communication with the ante chamber 32. The lowering of the elevator 21 moves the wafer carrier 18 into the vacuum chamber 10.

When the ante chamber 32 is at substantially atmospheric pressure, the lid 27 can be easily lifted from the top wall 11. If the ante chamber 32 were not at substantially atmospheric pressure, the pressure on the lid 27 would be so great as to require a very large force to raise the lid 27.

By using the dry gaseous nitrogen to produce the substantially atmospheric pressure in the ante chamber 32, the time for subsequently producing the required vacuum level therein is reduced since nitrogen does not contain moisture. Furthermore, the nitrogen meets the class 100 environment requirement whereas untreated compressed air may not meet this requirement.

Figure 5:
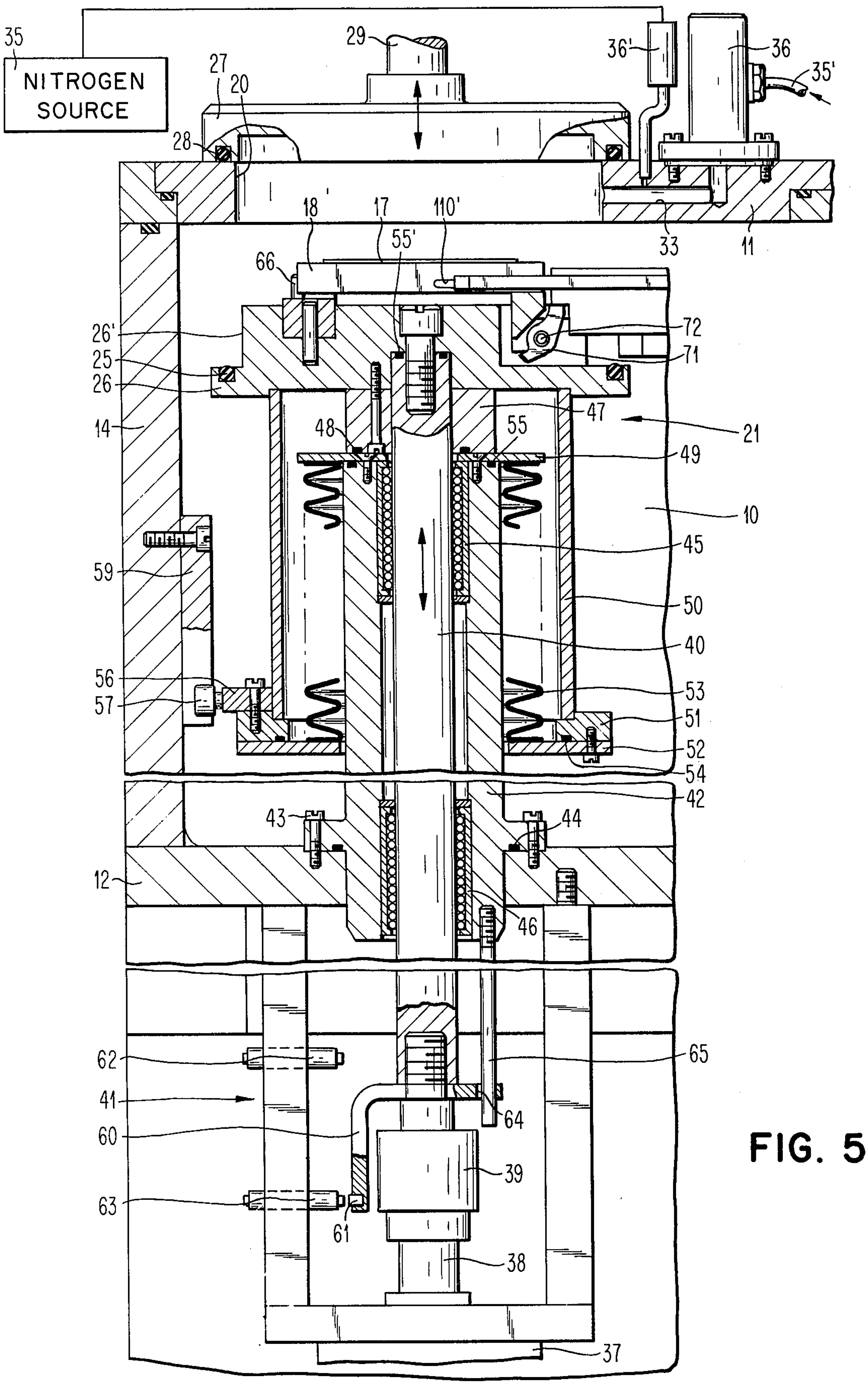
FIG. 5 is a sectional view, partly in elevation, of the elevator and its actuating mechanism and taken along line 5—5 of FIG. 1.

As shown in FIG. 5, the elevator 21 is moved vertically by an actuator 37 having its piston rod 38 connected to the platform 26 through a coupling 39 and a drive shaft 40. The actuator 37 is supported from the bottom wall 12 of the vacuum chamber 10 by support brackets 41. One suitable example of the actuator 37 is a tandem double acting air-oil cylinder sold as Model No. J61B, A50B Assembly by Miller Fluid Power Division, Flick-Reedy Corporation with the air cylinder as the driving force and the oil cylinder as a regulating device.

The device shaft 40 extends through a pedestal or guide post 42, which is secured to the bottom wall 12 of the vacuum chamber 10 by screws 43. The pedestal 42 supports an O-ring 44 for cooperation with the upper surface of the bottom wall 12 of the vacuum chamber 10 to form a vacuum seal therebetween. Ball bushings 45 and 46 are supported within the pedestal 42 to slidably support the drive shaft 40 at the upper and lower ends of the pedestal 42.

The upper end of the drive shaft 40 extends through a block 47, which is secured to the bottom of the elevator platform 26. The block 47 has a resilient ring 48 supported in its lower surface to cushion the engagement of the block 47 with an annular plate 49, which is fixed to the upper end of the pedestal 42.

The platform 26 has the upper end of a cylindrical tube 50 welded thereto. The lower end of the cylindrical tube 50 has an annular block 51 welded thereto with an annular plate 52 fixed to the bottom of the block 51. The upper surface of the plate 52 is connected to the lower surface of the plate 49 by a metallic bellows 53. The plate 49 and the plate 52 form a welded assembly with the metallic bellows 53.

An O-ring 54 is supported in the lower surface of the block 51 for cooperation with the upper surface of the plate 52 to form a vacuum seal therebetween exterior of the metallic bellows 53. An O-ring 55 is supported in the upper surface of the pedestal 42 for cooperation with the lower surface of the plate 49 to form a vacuum seal therebetween interior of the metallic bellows 53. An O-ring 55' is supported in the upper end of the drive shaft 40 for cooperation with the platform 26 to form a vacuum seal therebetween. Accordingly, the vacuum chamber 10 is sealed from the space between the outer surface of the bellows 53 and the inner surface of the cylindrical tube 50 since this space communicates exterior of the vacuum chamber 10 through the bottom of the pedestal 42 because of the drive shaft 40 sliding within the ball bushings 45 and 46.

The upper surface of the block 51 has a roller support 56 secured thereto with a pair of rollers 57 extending therefrom for cooperation with opposite sides of a longitudinal guide 59, which is secured to one of the side walls 14 of the vacuum chamber 10. This insures that the elevator platform 26 moves only vertically.

The lower end of the drive shaft 40 has a bracket 60 supported thereon and carries a magnet 61 at one end thereof. During the vertical movement of the elevator 21 by the drive shaft 40, the magnet 61 passes adjacent limit microswitches 62 and 63, which are carried by the support brackets 41 to produce signals to indicate when the elevator 21 is in its upper and lower positions so as to cause the next portion of the cycle to occur.

The bracket 60 has an opening 64 therein to receive a guide rod 65, which extends downwardly from the pedestal 42. This insures that the magnet 61 always travels in a vertical path so that it can cause activation of the limit microswitches 62 and 63.

The wafer carrier 18 is located on the elevator platform 26 on three pads through a pin 66 (see FIGS. 4, 4A and 5) on the elevator platform 26 cooperating with a surface 67 (see FIGS. 4 and 7) on the wafer carrier 18 and a pin 68 (see FIGS. 4 and 4B) cooperating with a V-shaped slot 69 (see FIG. 4) in the wafer carrier 18 on the same side of the wafer carrier 18 as the surface 67. A pivotally mounted retainer 70 on the elevator platform 26 cooperates with the opposite side of the wafer carrier 18 from the surface 67 and the slot 69 to releasably lock the wafer carrier 18 on the elevator platform 26.

Figures 4, 4A, 4B, 4C:
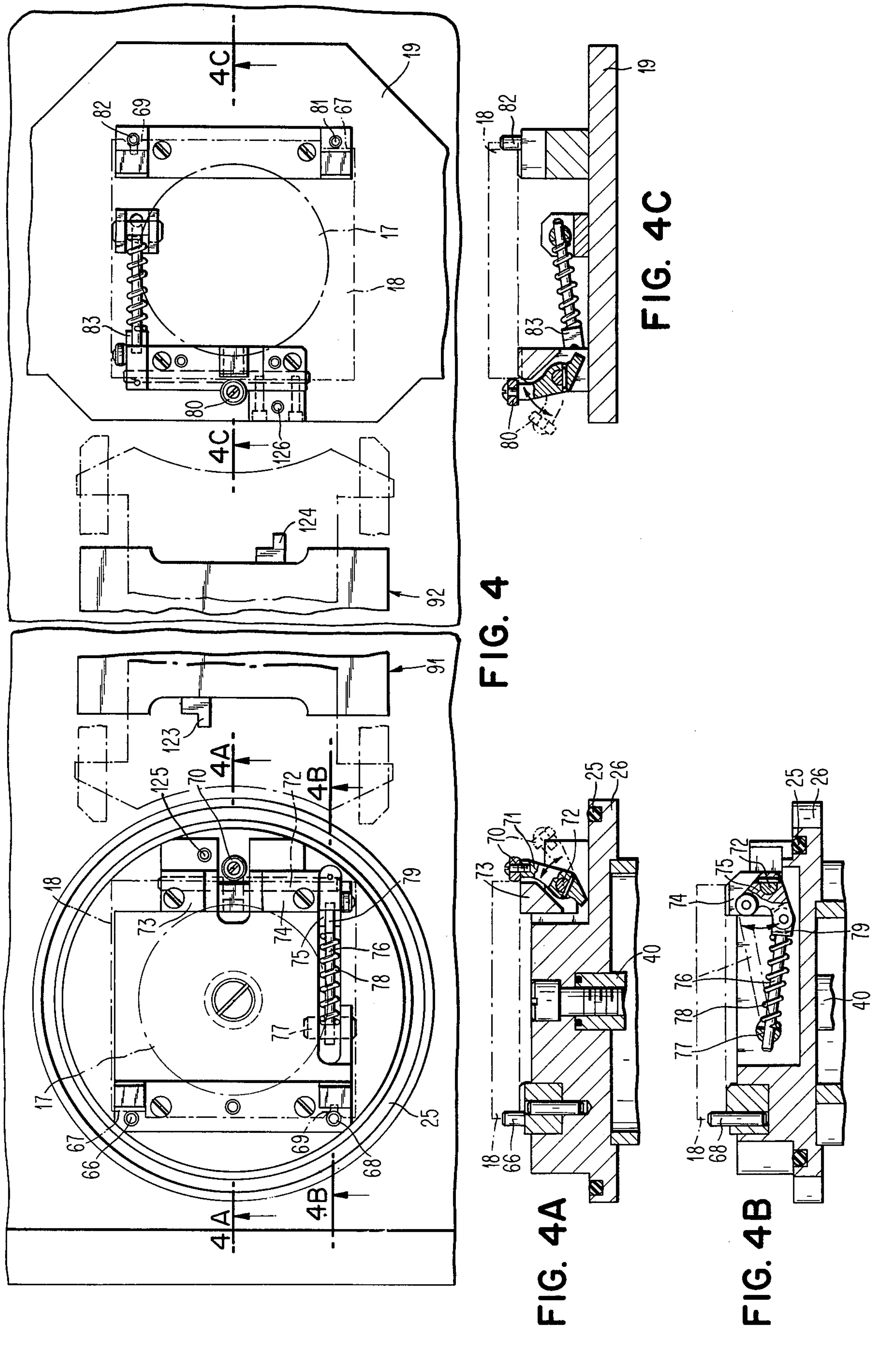
FIG. 4 is a top plan view showing wafer carriers on the elevator and the X-Y table and the relationship of the transfer arm mechanism relative thereto and taken along line 4—4 of FIG. 1.
FIG. 4A is a sectional view, partly in elevation, of the elevator of FIG. 4 and taken along line 4A—4A of FIG. 4.
FIG. 4B is a sectional view, partly in elevation, of the elevator of FIG. 4 and taken along line 4B—4B of FIG. 4.
FIG. 4C is a sectional view, partly in elevation, of the X-Y table of FIG. 4 and taken along line 4C—4C of FIG. 4.

The retainer 70 is mounted on the end of an arm 71 (see FIG. 4A), which is secured to a rod 72 (see FIGS. 4, 4A and 4B). The rod 72 is pivotally supported in a pair of bearing blocks 73 and 74 (see FIG. 4), which are secured to the platform 26.

One end of the rod 72 extends beyond the end of the bearing block 74 and has an actuating lever 75 (see FIG. 4B) fixed thereto. A rod 76 is pivotally connected to the lever 75 and also is slidably disposed within a pivot block 77, which is rotatably supported in an opening in a portion of the platform 26. A spring 78 is disposed between the pivot block 77 and a connecting block 79, which pivotally connects the rod 76 to the lever 75. The spring 78 urges the retainer 70 to either the solid line position of FIG. 4A in which the retainer 70 engages the side of the wafer carrier 18 or to the phantom line position of FIG. 4A in which the retainer 70 does not engage the wafer carrier 18 but is positioned beneath a horizontal plane containing the bottom surface of the carrier 18. Within the vacuum chamber 10, the position of the retainer 70 is determined by an actuating means on the transfer mechanism 22.

A similar arrangement exists for the X-Y table 19. Thus, a retainer 80 (see FIGS. 4 and 4C) engages one side of the wafer carrier 18 and pins 81 and 82 cooperate with the surface 67 and the slot 69, respectively, on the opposite side of the wafer carrier 18. The retainer 80 is activated by the actuating means of the transfer mechanism 22 engaging an activating lever 83 connected to the retainer 80.

Figure 6:
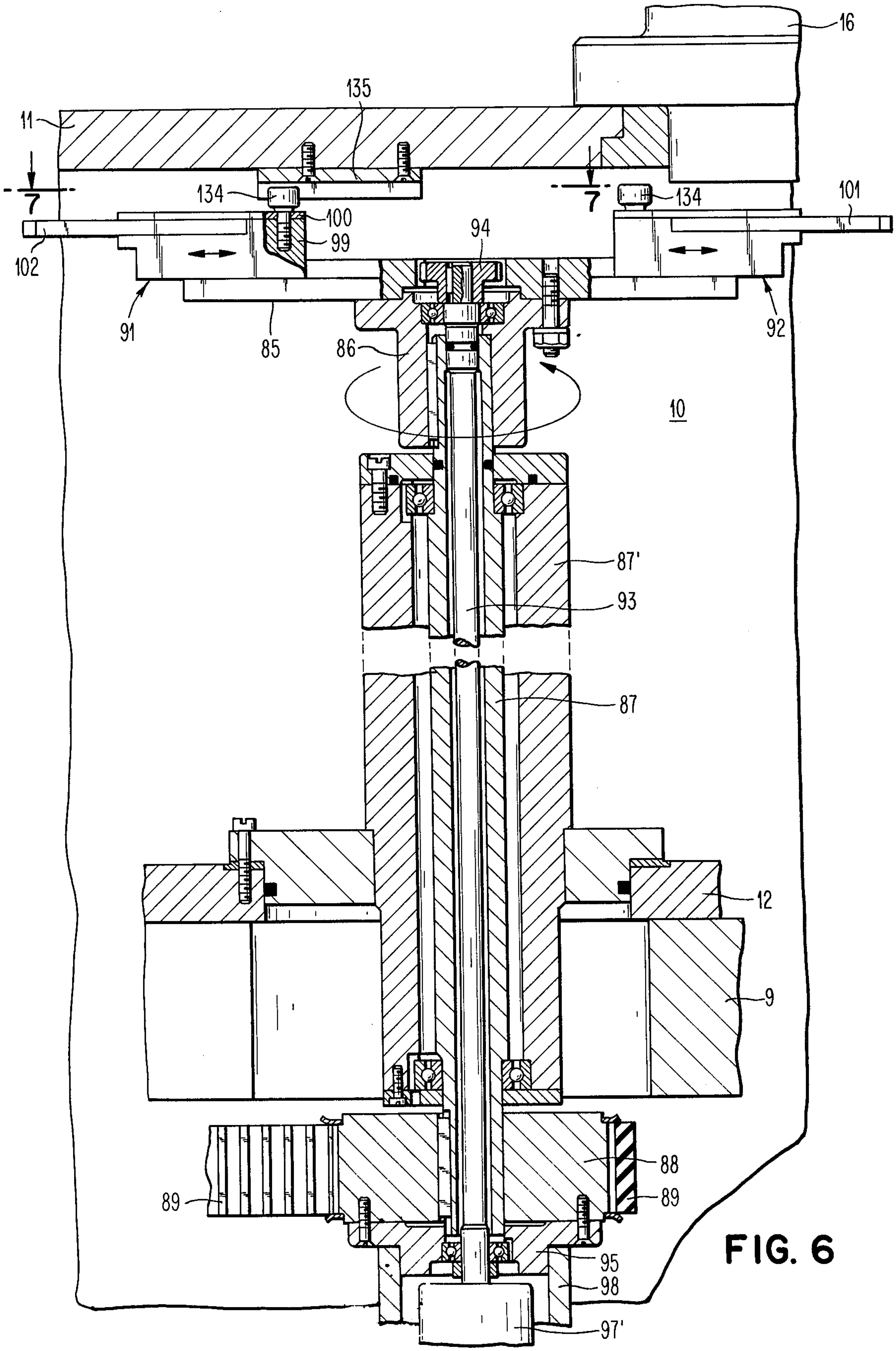
FIG. 6 is a sectional view, partly in elevation, of the actuating mechanism for the transfer arm mechanism.

The transfer mechanism 22 includes an arm 85, which is secured to a hub 86 (see FIG. 6) at the upper end of a drive shaft 87. The hub 86 is keyed to the drive shaft 87 for rotation therewith. The drive shaft 87 is rotatably supported in a housing 87', which is supported by the bottom wall 12 of the vacuum chamber 10.

The lower end of the drive shaft 87 is keyed to a pulley 88, which is driven by a timing belt 89. The timing belt 89 is driven by an indexer (not shown), which is activated by an electric motor (not shown). One suitable example of the indexer is sold by Furguson Corporation as Model No. P3-2FM 62-270.

Accordingly, each time that the indexer motor is activated, the arm 85 is rotated through 180°. Thus, the transfer mechanism 22 is rotated 180° during each activation of the indexer. Therefore, the arm 85 is always disposed at the end of each indexing cycle so that gripping assemblies or means 91 and 92 on opposite ends of the arm 85 are positioned for cooperation with the wafer carriers 18 on the elevator platform 26 and the X-Y table 19.

An inner drive shaft 93 extends through the hollow drive shaft 87 and has a pinion gear 94 secured to its upper end. The inner drive shaft 93 is rotatably supported adjacent its lower end in a support block 95, which is fixed to the pulley 88 for rotation therewith.

The pinion gear 94 meshes with a pair of racks 96 and 97 (see FIG. 7), which cooperate with the gripping assemblies 91 and 92, respectively. The racks 96 and 97 are slidably supported by the arm 85.

The inner drive shaft 93 is connected through a coupling 97' (see FIG. 6) to an air driven rotary actuator (not shown), which is supported by a pair of plates 98 fixed to opposite sides of the support block 95. When the rotary actuator is activated to rotate the pinion gear 94, the pinion gear 94 is rotated through 270° in one direction and then rotated through 270° in the opposite direction.

When the pinion gear 94 rotates the arm 85 through 270° in one direction, a first stop (not shown), which is carried by the coupling 97', engages a first set screw (not shown), which is carried by a first horizontally disposed bar (not shown), extending between the vertically disposed plates 98, to stop rotation of the pinion gear 94 after rotation through 270°. At this time, a first magnet (not shown), which is similar to the magnet 61 and is disposed on the coupling 97' diametrically opposite to the first stop, is positioned adjacent a limit microswitch (not shown), which is carried by one of the plates 98, to provide a signal to indicate the rotation of the pinion gear 94 through 270° is completed.

When rotation of the pinion gear 94 in the opposite direction occurs, a second stop (not shown), which also is mounted on the coupling 97' but in a different horizontal plane than the first stop, engages a second set screw (not shown), which is carried on a second horizontally disposed bar (not shown) extending between the plates 98 on the opposite side thereof from the first bar and slightly lower, to stop rotation of the pinion gear 94 after rotation through 270°. At this time, a second magnet (not shown), which is similar to the magnet 61 and is supported on the coupling 97' beneath the second stop, is positioned adjacent a second limit microswitch, which is carried by the other of the parallel plates 98 so as to be diametrically disposed to the first limit microswitch. This produces a signal to indicate that the pinion gear 94 has completed 270° rotation in the opposite direction.

Whenever the pulley 88 is rotated by the indexer to cause rotation of the arm 85 through 180°, the rotary actuator moves therewith because it is connected to the pulley 88 through the plates 98. Thus, there is no relative rotation between the arm 85 and the pinion gear 94. If the pinion gear 94 were not rotated when the arm 85 is rotated, the rotation of the arm 85 would cause the racks 96 and 97 to move about the pinion gear 94 during rotation of the arm 85.

The plates 98 have a magnet (not shown), which is similar to the magnet 61, connected thereto for cooperation with a pair of stationary limit microswitches (not shown), which are similar to the microswitches 62 and 63. Thus, whenever the pulley 88 completes 180° of rotation, the magnet is disposed adjacent one of the two limit microswitches to provide a signal to stop rotation of the pulley 88 by the indexer and to initiate the next portion of the cycle of operation. Whenever the pulley 88 completes an additional 180° of rotation in the same direction, the magnet is disposed adjacent the other of the two limit microswitches to provide a signal to stop rotation of the pulley 88 by the indexer and to initiate the next portion of the cycle of operation.

Each of the gripping assemblies 91 and 92 includes a retaining block 99 (see FIG. 7B), a retaining plate 100 secured to the upper surface of the retaining block 99, and a retaining plate 100' (see FIGS. 7C and 7D) secured to the lower surface of the retaining block 99. The retaining block 99 and the retaining plates 100 and 100' form a body, which is slidably mounted on the arm 85 and adapted to be extended and retracted by the cooperating rack 96 or 97.

The retaining block 99 has a pair of L-shaped grippers 101 and 102 (see FIGS. 7, 8A, and 8B) supported thereon in a recess 102' for movement therewith. The gripper 102 is formed so that a portion 103 (see FIG. 7B) thereof overlaps a portion 104 of the gripper 101. The portion 103 of the gripper 102 has a cut out recess 105 to enable a cylindrical roller 106 (see FIGS. 7 and 7B) to be supported downwardly therethrough from a corner of the gripper 101. The gripper 102 has a cylindrical roller 107 protruding downwardly therefrom adjacent the roller 106. The rollers 106 and 107 extend into a recess 107' (see FIGS. 7 and 7B), which is formed in the retaining block 99 beneath the recess 102' and communicating therewith.

Figure 7:
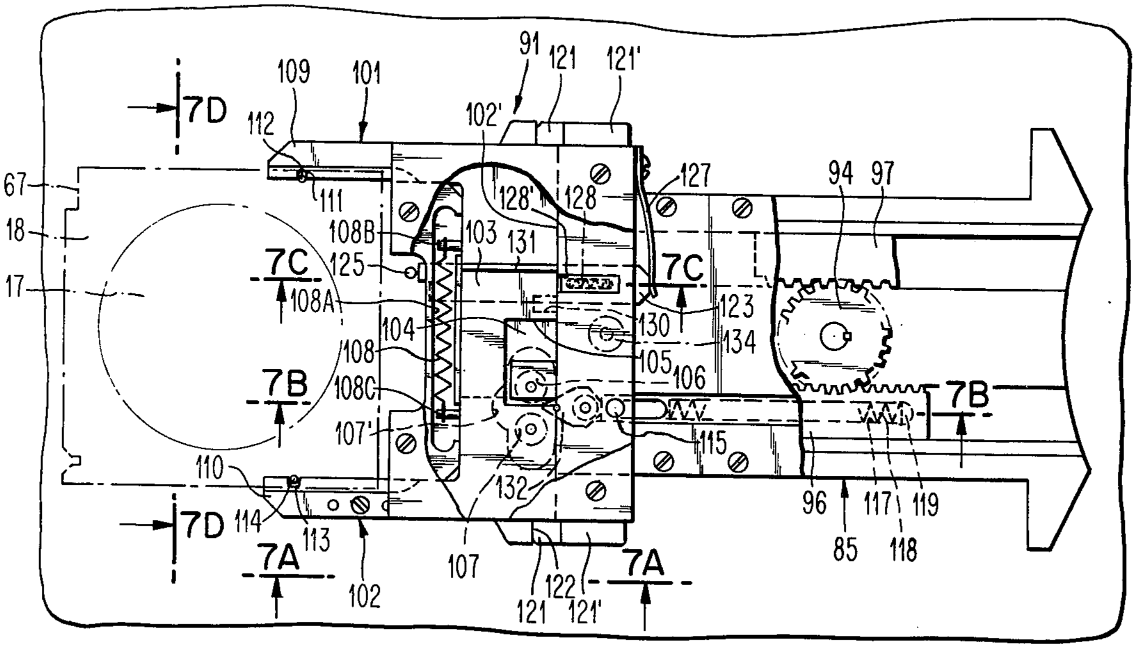
FIG. 7 is a top plan view, partly broken away, of a portion of the transfer arm mechanism including one of the gripping assemblies with the carrier being grasped by the gripping assembly and the gripping assembly ready to be retracted from its extended position and taken along line 7—7 of FIG. 6.
Figure 7A:
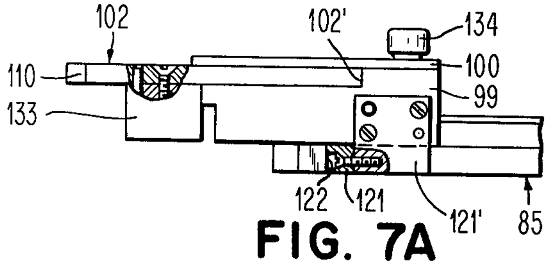
FIG. 7A is a side elevational view, partly in section, of the gripping assembly of FIG. 7 and taken along line 7A—7A of FIG. 7.
Figure 7B:
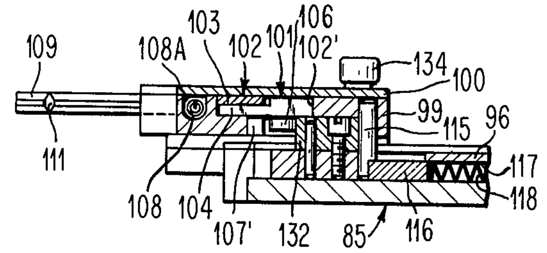
FIG. 7B is a sectional view, partly in elevation, of a portion of the gripping assembly of FIG. 7 and taken along line 7B—7B of FIG. 7.
Figure 7D:
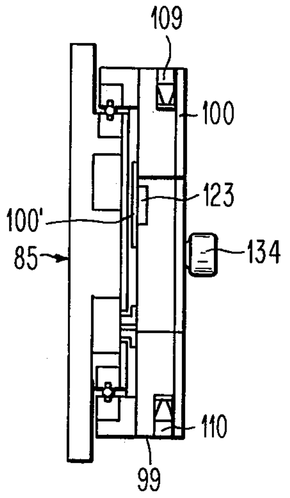
FIG. 7D is an end elevational view of the gripping assembly of FIG. 7 and taken along line 7D—7D of FIG. 7.
Figure 7C:
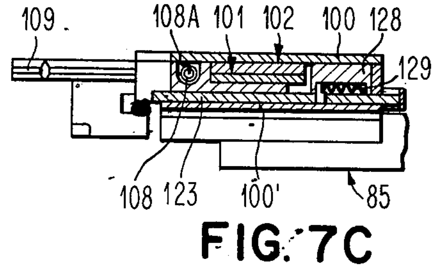
FIG. 7C is a sectional view, partly in elevation, of the gripping assembly of FIG. 7 and taken along line 7C—7C of FIG. 7.
Figure 8A:
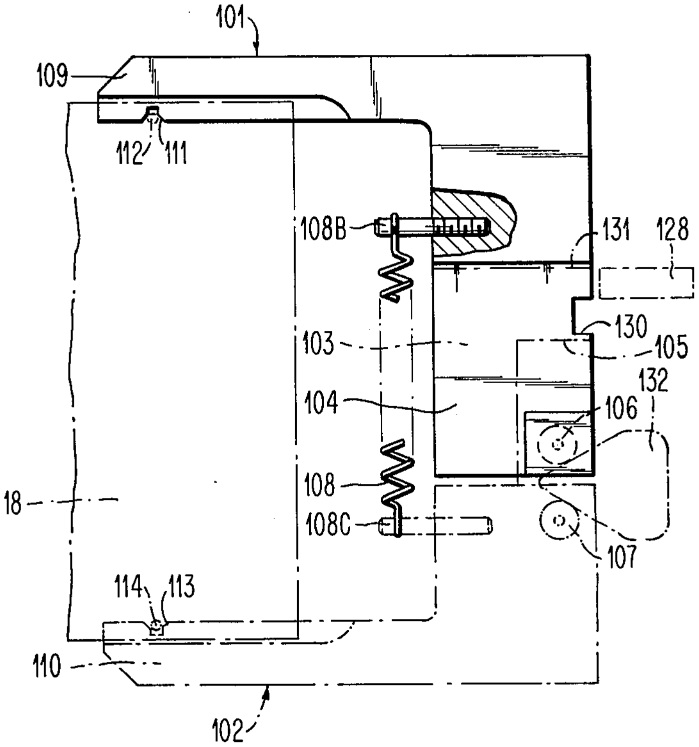
FIG. 8A is a top plan view of one of the grippers of the gripping assembly with the other of the grippers in phantom and showing the grippers in a grasping position.
Figure 8C:
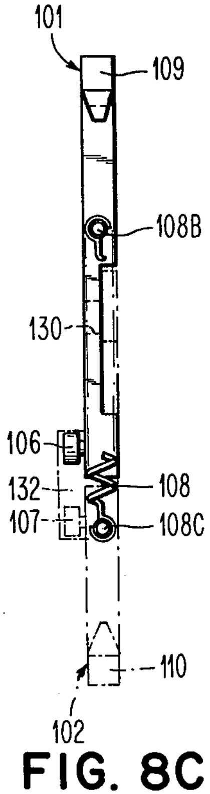
FIG. 8C is an end elevational view of the grippers of FIG. 8A.

A spring 108 continuously urges the grippers 101 and 102 toward each other. The spring 108, which is disposed within a passage 108A (see FIGS. 7B and 7C) formed in the retaining block 99 and beneath the retaining plate 100, is connected to the grippers 101 and 102 by pins 108B and 108C (see FIG. 7), respectively. Thus, the spring 108 continuously urges the L-shaped grippers 101 and 102 toward each other to a position in which jaws 109 and 110 at the extremities of the L-shaped grippers 101 and 102, respectively, can engage the wafer carrier 18 as shown in FIG. 7.

Each of the jaws 109 and 110 is V-shaped to fit in a cooperating V-shaped groove 110' (see FIG. 5) in opposite sides of the wafer carrier 18. The jaw 109 has a slot 111 (see FIG. 7B) for cooperation with a pin 112 (see FIG. 7) on the wafer carrier 18, and the jaw 110 has a slot 113 for cooperation with a pin 114 on the wafer carrier 18. Accordingly, when the jaws 109 and 110 have their slots 111 and 113, respectively, receiving the pins 112 and 114, respectively, the wafer carrier 18 is gripped by the grippers 101 and 102.

During the initial extension of the racks 96 and 97, the gripping assemblies 91 and 92 are extended away from each other by means of the rack 96 or 97 driving the retaining block 99 along the arm 85 through a downwardly depending pin 115 (see FIG. 7B) on the retaining block 99 being engaged by a slug 116, which is disposed within a recess 117 in the rack 96 or 97. The slug 116 is connected through an override spring 118 and a spring retainer 119 (see FIG. 7), which also are positioned within the recess 117, to the rack 96 or 97. The movement of the retaining block 99 carries the grippers 101 and 102 therewith.

The sliding extension of the retaining block 99 and the L-shaped grippers 101 and 102 continues until stops 121 (see FIGS. 7 and 7A), which are secured on opposite sides of the retaining block 99 by brackets 121', engage shoulders 122 on the arm 85. When this occurs, further movement of the retaining block 99 by the rack 96 or 97 is stopped even though the rack 96 or 97 has not completed its extension. At this time, the jaws 109 and 110 are in the outermost position on the arm 85 at which they would engage the wafer carrier 18, if moved toward each other, irrespective of whether one of the wafer carriers 18 is supported on the elevator 21 or the X-Y table 19.

Prior to the stops 121 engaging the shoulders 122 on the arm 85, a programming key 123 (see FIG. 7) of the gripping assembly 91 engages a pin 125 on the elevator platform 26 and a programming key 124 (see FIG. 4) of the gripping assembly 92 engages a pin 126 on the X-Y table 19. The programming keys 123 an 124 are slides and are the same except that the reduced end of the programming key 123 can engage only the pin 125, and the reduced end of the programming key 124 can engage only the pin 126. Thus, when the transfer mechanism 22 is indexed 180° so that the gripping assembly 91 is disposed at the X-Y table 19 (see step 7 of FIG. 3) and the gripping assembly 92 is disposed at the elevator 21, the programming keys 123 and 124 will not engage the pins 126 and 125, respectively, because the pins 126 and 125 are aligned with the notched portions of the programming keys 123 and 124, respectively.

The programming keys 123 and 124 are slidably supported within the retaining block 99 of the gripping assemblies 91 and 92, respectively. Each of the programming keys 123 and 124 is urged by a spring 127 (see FIG. 7), which is carried by the retaining block 99, to a position in which it engages or misses the pin 125 or 126 prior to the stops 121 engaging the shoulders 122 of the arm 85.

Figure 8B:
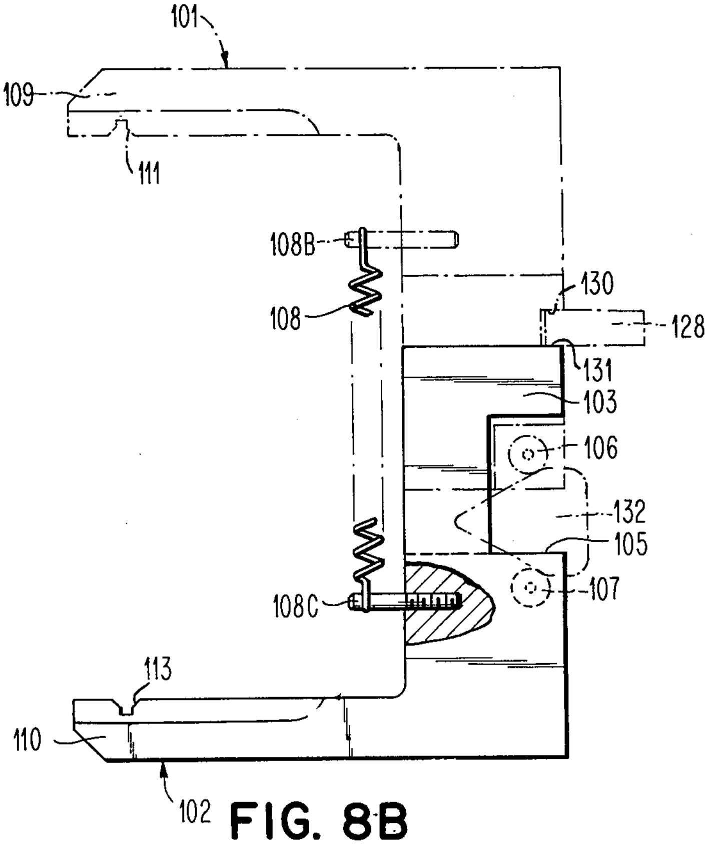
FIG. 8B is a top plan view of the other of the grippers of the gripping assembly with the solid line gripper of FIG. 8A in phantom and showing the grippers held in a non-grasping position by a latch key.

When the programming key 123 has the end of its reduced portion engaging the pin 125 as shown in FIG. 7 and the programming key 124 has the end of its reduced portion engaging the pin 126 (these occur at the same time), each of the programming keys 123 and 124 is stopped while the remainder of the gripping assemblies 91 and 92 continue to move. This moves each of the programming keys 123 and 124 against the force of the cooperating spring 127. This causes a latch key 128 (see FIG. 7C), which is slidably disposed in a recess 128' (see FIG. 7) in the retaining block 99 and is connected to the programming key 123 or 124 through a spring 129, to attempt to stop with the programming key 123 or 124. At the time that the programming keys 123 and 124 strike the pins 125 and 126, respectively, the latch key 128 is disposed in a notch 130 in the gripper 101 and also is acting against an end 131 of the gripper 101 to hold the jaws 109 and 110 of the grippers 101 and 102, respectively, in a non-grasping position as shown in FIG. 8B.

Therefore, when the programming keys 123 and 124 stop because of engaging the pins 125 and 126, respectively, the latch key 128 cannot stop with the connected programming key 123 and 124 because the force produced by the spring 108 is greater than the force of the spring 129. Thus, even though the programming keys 123 and 124 cease to follow the extension of the grippers 101 and 102, the latch key 128 continues to be retained between the grippers 101 and 102 to hold the jaws 109 and 110 in the non-grasping position.

Accordingly, when further movement of the retaining block 99 is stopped due to the stops 121 on the retaining block 99 engaging the shoulders 122 on the arm 85, movement of the grippers 101 and 102 away from each other and against the force of the spring 108 occurs because a wedge 132 (see FIGS. 7 and 7B), which is fixed to the rack 96 or 97, moves between the rollers 106 and 107 due to the continued movement of the rack 96 or 97. When this occurs, the latch key 128 is released and is returned by the spring 129 to the position of FIG. 7C. However, the grippers 101 and 102 cannot move toward each other because the wedge 132 is disposed between the rollers 106 and 107.

When the grippers 101 and 102 are held away from each other in the non-grasping position by the latch key 128 during extension of the racks 96 and 97, a cam block 133 (see FIG. 7A) on the lower surface of the jaw 110 of each of the gripping assemblies 91 and 92 is disposed so as to not engage the actuating lever 75 (see FIGS. 4 and 4B) of the elevator 21 and the actuating lever 83 (see FIG. 4) of the X-Y table 19. Thus, the retainers 70 and 80 continue to hold the carriers 18 on the elevator 21 and the X-Y table 19.

After the racks 96 and 97 have completed their extensions, the pinion gear 94 is then rotated in the opposite direction to retract the racks 96 and 97 towards each other. The initial retraction of the racks 96 and 97 withdraws the wedge 132 from between the rollers 106 and 107 to allow the jaws 109 and 110 to be moved toward each other to grip or grasp the wafer carrier 18. When this occurs, the slots 111 and 113 of the jaws 109 and 110, respectively, engage the pins 112 and 114, respectively, on the wafer carrier 18 as shown in FIG. 7.

This movement of the jaws 109 and 110 towards each other is produced by the spring 108 since the latch key 128 is disposed out of the position in which it would prevent the jaws 109 and 110 from moving toward each other. This movement of the jaws 109 and 110 towards each other results in the cam block 133 on each of the gripping assemblies 91 and 92 now being disposed in a position in which the cam block 133 on the gripping assembly 91 engages the actuating lever 75 and the cam block 133 on the gripping assembly 92 engages the actuating lever 83 when the gripping assemblies 91 and 92 are retracted.

Further retraction of each of the racks 96 and 97 results in the wedge 132 engaging the pin 115 (see FIG. 7B) on the retaining block 99 to cause the retaining block 99 and the L-shaped grippers 101 and 102 to be retracted. This retraction continues until the pinion gear 94 is returned to its start position. At this time, the wafer carriers 18 are grasped within the gripping assemblies 91 and 92 but retracted sufficiently from the elevator 21 and the X-Y table 19 to be able to be rotated relative thereto through 180° by means of the drive shaft 87 (see FIG. 6).

With the wafer carriers 18 grasped by the gripping assemblies 91 and 92 and the racks 96 and 97 completely retracted, the drive shaft 87 is rotated by the indexer to rotate the arm 85 through 180°. After a signal is received to indicate that the arm 85 has completed rotation through 180°, the pinion gear 94 is rotated by its drive shaft 93 to extend the gripping assemblies 91 and 92 away from each other in the same manner as previously described.

Since the jaws 109 and 110 are gripping the wafer carriers 18, the cam block 133 (see FIG. 7A) on the jaw 110 of the gripping assembly 91 is disposed to engage the actuating lever 83 (see FIG. 4) during extension of the rack 96 and the cam block 133 on the jaw 110 of the gripping assembly 92 is positioned to contact the actuating lever 75 (see FIGS. 4 and 4B) during extension of the rack 97. Accordingly, as the wafer carriers 18 are disposed on the X-Y table 19 and the elevator 21 by the gripping assemblies 91 and 92 being extended by the racks 96 and 97, the retainers 80 and 70 are pivoted upwardly by engagement of their actuating levers 83 and 75 by the cam blocks 133 on the gripping assemblies 91 and 92, respectively, to lock the wafer carriers 18 on the X-Y table 19 and the elevator 21.

As the gripping assembly 91 is extended, the programming key 123 will not engage the pin 126 on the X-Y table 19 since the notch in the programming key 123 is aligned with the pin 126. Thus, before the end of the notch portion of the programming key 123 can engage the pin 126, movement of the gripping assembly 91 towards the X-Y table 19 is stopped by the stops 121 engaging the shoulders 122 on the arm 85. A similar arrangement exits between the programming key 124 of the gripping assembly 92 and the pin 125 on the elevator 21.

The racks 96 and 97 continue to extend after the stops 121 on the gripping assemblies 91 and 92 engate the shoulders 122 on the arm 85. As a result, the jaws 109 and 110 of each of the gripping means 91 and 92 are moved away from each other by the wedge 132 moving between the rollers 106 and 107. Because the programming key 123 is not engaging the pin 126 and the programming key 124 is not engaging the pin 125, the latch key 128 of each of the programming keys 123 and 124 enters the notch 130 in the gripper 101 and abuts against the end 131 of the gripper 102 due to the spring 127. As a result, the jaws 109 and 110 of each of the gripping assemblies 91 and 92 are locked in a non-grasping position by the latch key 128 as shown in FIG. 8B.

Upon completion of the extension of the racks 96 and 97, the rotation of the pinion gear 94 is reversed, and the racks 96 and 97 are retracted. The initial retraction of each of the racks 96 and 97 withdraws the connected wedge 132 from between the rollers 106 and 107. This causes the spring 108 to clamp the latch key 128 in the notch 130 of the gripper 101 and against the end 131 of the gripper 102.

The continued retraction of the racks 96 and 97 causes the rack 96 or 97 and its connected wedge 132 to engage the forward surface of the pin 115 (see FIG. 7B) on the retaining block 99 to cause retraction of each of the gripping assemblies 91 and 92. With the latch key 128 holding the jaws 109 and 110 in a non-grasping position, the cam block 133 of each of the gripping assemblies 91 and 92 is disposed so that the actuating lever 83 at the X-Y table 19 and the actuating lever 75 at the elevator 21 are not engaged by the cam blocks 133 of the gripping assemblies 91 and 92, respectively. Thus, the retainers 80 and 70 remain in their wafer carrier holding positions.

When the racks 96 and 97 complete their retraction, the jaws 109 and 110 of each of the gripping assemblies 91 and 92 are withdrawn sufficiently from the table 19 and the elevator 21 so that they will not engage the wafer carrier 18 on the X-Y table 19 or the elevator 21 when the arm 85 is again indexed through 180°. Accordingly, upon retraction of the racks 96 and 97 being completed, the arm 85 is rotated through 180° to again position the gripping assembly 91 for cooperation with the wafer carrier 18 on the elevator 21 and the gripping assembly 92 for cooperation with the wafer carrier 18 on the X-Y table 19. Then, the extension of the racks 96 and 97 occurs as previously described to repeat the cycle.

Considering the operation of the present invention, it will be assumed that one of the wafer carriers 18 is disposed on the X-Y table 19 and that the elevator 21 is in its uppermost position to seal the opening 20 and that the lid 27 has been raised to enable one of the wafer carriers 18 to be positioned on the elevator 21. The new wafer carrier 18 is shown disposed on the elevator 21 at step 1 of FIG. 2. At this time, the arm 85 is in its non-grasping position with the gripping assemblies 91 and 92 fully retracted.

Then, the lid 27 is moved downwardly to seal the opening 20 from the atmosphere and to form the ante chamber 32. This is shown at step 2 of FIG. 2. After the lid 27 is in sealing engagement with the upper surface of the top wall 11 of the vacuum chamber 10, the introduction of nitrogen into the ante chamber 32 ceases through a closing of the valve 36', and the vacuum pump 34 produces a partial vacuum within the ante chamber 32 by opening the valve 36.

When a gauge indicates that the pressure in the ante chamber 32 is at the desired vacuum level, the valve 36 is closed, and the elevator 21 is then moved downwardly to its lowermost position. This is shown at step 3 of FIG. 2.

During the time that the elevator 21 has moved upwardly from its lowermost position to deliver the wafer carrier 18 thereon to the exterior of the vacuum chamber 10, the X-Y table 19 is positioning the wafer carrier 18 to its desired position and all pattern writing on the chips of the wafer 17 then occurs. There is no movement of the elevator 21 or the transfer mechanism 22 during pattern writing on the chips of the wafer 17.

Figure 2:
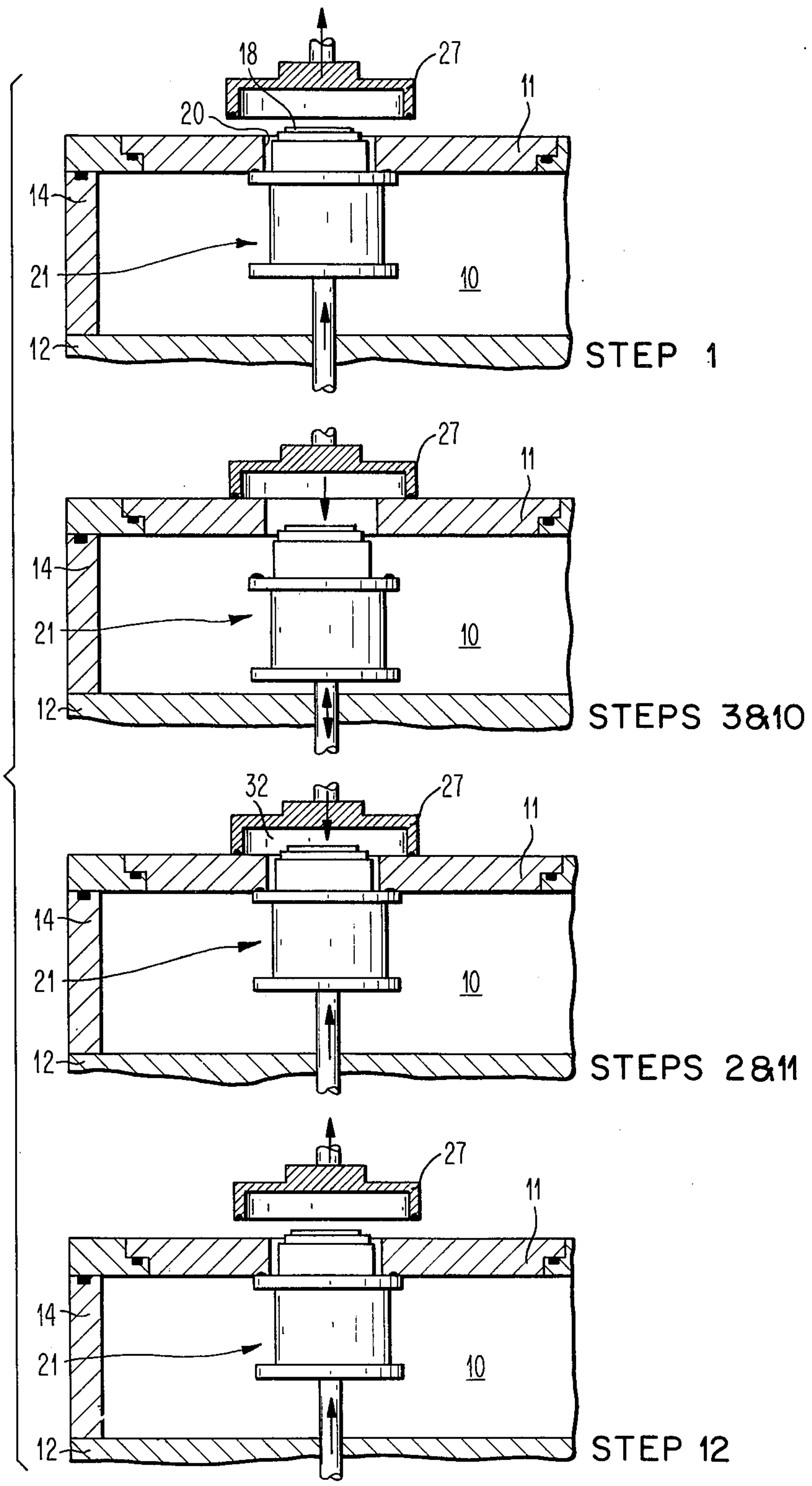
FIG. 2 is a schematic sectional view showing the relationships between the elevator and the lid of the apparatus at various times during wafer transfer.

When pattern writing of the chips on the wafer 17 is completed, the wafer carrier 18 is removed from the elevator 21, and another of the wafer carriers 18 is received for return into the interior of vacuum chamber 10 to the position shown at step 3 of FIG. 2. After the elevator 21 has completed its downward movement, the gripping assemblies 91 and 92 are moved to the solid line position at step 4 of FIG. 3 by extension of the racks 96 and 97. Then, the jaws 109 and 110 of the gripping assemblies 91 and 92 are moved from the solid line position at step 4 of FIG. 3 to the phantom line position. This is accomplished by the initial retraction of the racks 96 and 97 removing the connected wedges 132 from between the rollers 106 and 107 of the gripping assemblies 91 and 92.

Figure 3:
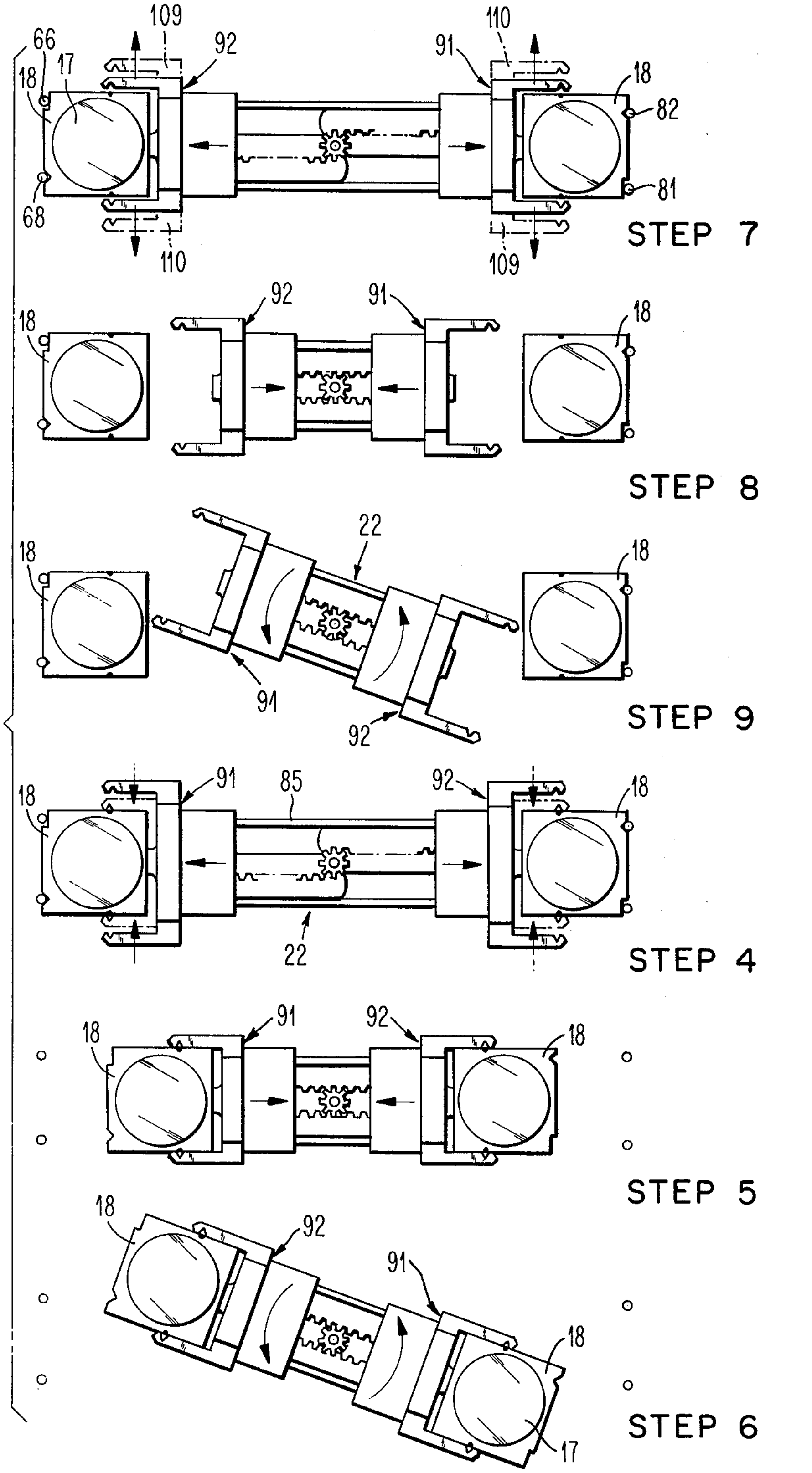
FIG. 3 is a schematic plan view showing the relationship of the transfer mechanism with respect to wafer carriers on the X-Y table and the elevator at various times during wafer transfer.

The gripping assemblies 91 and 92 are then retracted from the phantom line position at step 4 of FIG. 3 to the position at step 5 of FIG. 3. In this position, the wafer carriers 18 are disposed so that counterclockwise rotation of the transfer mechanism 22 by the drive shaft 87 (see FIG. 6) moves the gripping assembly 91 to the position adjacent the X-Y table 19 and the gripping assembly 92 to a position adjacent the elevator 21. This results in the wafer 17, which has the patterns written on its chips, being adjacent the elevator 21 as shown at step 7 of FIG. 3 and the new wafer 17, which is to have the patterns written on its chips, now adjacent the X-Y table 19.

Then, the racks 96 and 97 are extended to move the wafer carriers 18 into positions over the X-Y table 19 and the elevator 21. At the completion of the extension of the racks 96 and 97, the jaws 109 and 110 of the gripping assemblies 91 and 92 move to the phantom line position at step 7 of FIG. 3 because of each of the wedges 132 cooperating with the corresponding rollers 106 and 107.

During extension of the racks 96 and 97 to position the gripping assemblies 91 and 92 in the solid line position at step 7 of FIG. 3, the cam block 133 on each of the gripping assemblies 91 and 92 is disposed to engage the actuating lever 83 (see FIG. 4) at the X-Y table 19 and the actuating lever 75 (see FIGS. 4 and 4B) at the elevator 21, respectively. This results in the wafer carriers 18 being locked on the X-Y table 19 and the elevator 21.

With the jaws 109 and 110 of the gripping assemblies 91 and 92 in the phantom line position at step 7 of FIG. 3, the cam block 133 on each of the gripping assemblies 91 and 92 cannot engage the actuating lever 83 at the X-Y table 19 or the actuating lever 75 at the elevator 21 during retraction of the gripping assemblies 91 and 92. The retraction of the racks 96 and 97 causes the gripping assemblies 91 and 92 to move towards each other as indicated at step 8 of FIG. 3 with the wafer carriers 18 remaining on the X-Y table 19 and the elevator 21.

When retraction of the gripping assemblies 91 and 92 is completed, the transfer mechanism 22 again is rotated counterclockwise 180°, as indicated at step 9 of FIG. 3, to the position for extension of the gripping assemblies 91 and 92 when the elevator 21 has a new one of the wafer carriers 18 thereon and pattern writing of the wafer 17 at the X-Y table 19 is completed.

Then, the elevator 21 is moved from the position at step 10 of FIG. 2 to the position at step 11 of FIG. 2. The upward movement of the elevator 21 results in the elevator platform 26 having the seal 25 engage the bottom surface of the top wall 11 of the vacuum chamber 10 to form a vacuum seal therewith.

Next, dry gaseous nitrogen from the source is supplied to the ante chamber 32 by opening the valve 36' (see FIG. 5). The nitrogen is bled into the ante chamber 32 for a predetermined period of time at a pressure of approximately 5 p.s.i. With the volume of the ante chamber 32 known, bleeding of the nitrogen for the predetermined period of time at the predetermined pressure results in the ante chamber 32 being at substantially atmospheric pressure.

The lid 27 is lifted upwardly by the piston rod 29 (see FIG. 1) of the air cylinder 30 to the position shown at step 12 of FIG. 2 with nitrogen being continually flushed into the atmosphere surrounding the wafer carrier 18 on the elevator 21. At this time, the wafer carrier 18, which has been supported on the elevator 21, is removed therefrom by any suitable automatic means or manually. Then, another of the wafer carriers 18 is deposited on the elevator 21, and the cycle can now be repeated beginning with step 1 of FIG. 2.

To prevent any inadvertent rotation of the transfer mechanism 22 when there has been any movement of the gripping assemblies 91 and 92 from the home position at which the racks 96 and 97 are fully retracted, each of the gripping assemblies 91 and 92 has a cam follower 134 (see FIG. 6) extending above the retaining plate 100 for cooperation with a cam 135, which is secured to the bottom surface of the top wall 11 of the vacuum chamber 10. The length of the cam 135 is such that the cam follower 134 of one of the gripping assemblies 91 and 92 cooperates therewith as soon as the gripping assemblies 91 and 92 start to move from their home positions for the entire extension of the gripping assemblies 91 and 92. The cam follower 134 of the gripping assembly 91 cooperates with the cam 135 when the arm 85 is disposed so that the gripping assembly 91 is cooperating with the elevator 21, and the cam follower 134 of the gripping assembly 92 cooperates with the cam 135 when the arm 85 is disposed so that the gripping assembly 92 is cooperating with the elevator 21.

While the transfer mechanism of the present invention has been shown and described as being used in a vacuum chamber, it should be understood that the transfer mechanism of the present invention could be employed for transferring workpieces in any environment. While the workpieces of the present invention have been shown and described as being semiconductor wafers having an electron beam writing patterns in chips thereon, it should be understood that the present invention may be utilized in any vacuum chamber in which a workpiece is to be processed in any manner.

It should be further understood that the present invention may be used to transport workpieces between two gaseous media through introduction of a compatible gas into the ante chamber 32 following evacuation and prior to assuming the configuration shown in step 3 of FIG. 2. An oxygen and moisture free work chamber also would be typically serviced by the mechanisms as described.

An advantage of this invention is that it decreases the cost of processing semiconductor chips by reducing the time to move a wafer having the chips into and out of a vacuum chamber. Another advantage of this invention is that it reduces the number of elements required for moving a workpiece into and out of a vacuum chamber. A further advantage of this invention is that the location of the transfer mechanism is always known if there should be a power failure during any cycle. Still another advantage of this invention is that it eliminates the need for high vacuum pumping of the ante chamber to maintain the vacuum level during transfer of wafers to and from the vacuum chamber. A still further advantage of this invention is that all of the critical components such as motors, sensing switches, pumps, and the like are exterior of the vacuum chamber for quick access for repair.

While the invention has been particularly shown and described with reference to a preferred embodiment thereof, it will be understood by those skilled in the art that various changes in form and details may be made therein without departing from the spirit and scope of the invention.

What is claimed is:

1. An apparatus for transferring a workpiece into and out of a chamber having a controlled environment through an opening in a wall of the chamber without affecting the environment in the chamber including:

vertically movable means disposed within the chamber;

means to vacuum seal the chamber from the opening in the wall of the chamber when said vertically movable means is in a first position, said vertically movable means being disposed to receive workpieces from and deliver workpieces to exterior of the chamber when in its first position;

movable means to vacuum seal the opening in the wall of the chamber from the atmosphere when said vertically movable means is removed from its first position;

said movable means and said vertically movable means cooperating to form an ante chamber therebetween when said vertically movable means is in its first position and said movable means is vacuum sealing the opening in the wall of the chamber;

means to produce a vacuum in the ante chamber after said vertically movable means receives a workpiece from exterior of the chamber and before said vertically movable means is moved from its first position to a second position in which said vertically movable means is not vacuum sealing the opening in the wall of the chamber, said vacuum producing means providing a vacuum so that the environment in the chamber is not affected by said vertically movable means moving from its first position to produce communication of said ante chamber with the chamber; and means to produce substantially atmospheric pressure in said ante chamber after said vertically movable means has moved from its second position to its first position to again form said ante chamber and prior to movement of said movable means to break the vacuum seal between the atmosphere and said ante chamber.

2. The apparatus according to claim 1 including means to transfer a workpiece on said vertically movable means from said vertically movable means to a work station when said vertically movable means is in its second position.

3. The apparatus according to claim 2 in which said vertically movable means comprises a first station when in its second position and the work station comprises a second station, said workpiece transfer means including:

a rotary arm;

said arm having workpiece gripping means disposed 180° from each other;

index means to rotate said arm 180° during each activation to always position each of said gripping means at one of the stations;

and each of said gripping means having means responsive to the station at which it is located to cause one of said gripping means to grasp one of the workpieces at only the first station and to release the grasped workpiece at only the second station and to cause the other of said gripping means to grasp one of the workpieces at only the second station and to release the grasped workpiece at only the first station.

4. The apparatus according to claim 3 in which each of said gripping means includes:

a body slidably mounted on said arm;

moving means to extend and retract said body along said arm when said arm is positioned so that said gripping means can cooperate with a workpiece support position at each of the first and second stations; and means mounted on said body for grasping a workpiece at one of the first and second stations for transfer of the workpiece to the other of the first and second stations when said arm is rotated 180° by said index means, said mounted means releasing the workpiece at the other of the first and second work stations.

5. The apparatus according to claim 4 in which:

said mounted means of each of said gripping means includes:

a pair of cooperating grippers mounted on said body for movement toward and away from each other;

and means continuously urging said grippers to the position in which said grippers grasp a workpiece;

and said responsive means includes:

first means to enable said urging means of said one gripping means to be effective to cause said grippers of said one gripping means to grasp the workpiece only at the first station; and second means to enable said urging means of said other gripping means to be effective to cause said grippers of said other gripping means to grasp the workpiece only at the second station.

6. The apparatus according to claim 5 in which each of said first and second means of said responsive means enables said urging means of each of said gripping means to be effective to cause said grippers to grasp a workpiece in response to movement of said moving means in the direction in which said body is retracted when said gripping means is at the station at which said gripping means grasps a workpiece.

7. The apparatus according to claim 6 including:

means cooperating with said grippers of each of said gripping means to move said grippers to a non-grasping position when said moving means is moved in the direction in which said body is extended after movement of said body by said moving means has been completed; and each of said first and second means of said responsive means including means to hold said grippers in a non-grasping position after said grippers have been moved to this position by said cooperating means when said gripping means is at the station at which said gripping means releases a workpiece.

8. The apparatus according to claim 7 in which:

each of said gripping means includes means to activate means at each of the stations to retain a workpiece when said gripping means is at the station at which said gripping means releases a workpiece, said activating means at each of the stations being effective after the workpiece has been disposed at the workpiece support position; and each of said activating means inactivating the workpiece retaining means at the other of the stations at which said gripping means grasps a workpiece, said activating means being effective to cause inactivation after said gripping means has grasped the workpiece.

9. The apparatus according to claim 8 in which said moving means includes means to cause simultaneous extension and retraction of said bodies of said gripping means.

10. The apparatus according to claim 4 in which said moving means includes means to cause simultaneous extension and retraction of said bodies of said gripping means.

11. The apparatus according to claim 3 in which each of said responsive means has means cooperating with means disposed at each of the first and second stations to determine whether said responsive means causes grasping or releasing of the workpiece by said gripping means.

12. The apparatus according to claim 3 in which:

each of said gripping means includes means to activate means at each of the stations to retain a workpiece when said gripping means is at the station at which said gripping means releases a workpiece, said activating means at each of the stations being effective after the workpiece has been disposed at a workpiece support position; and each of said activating means inactivating the workpiece retaining means at the other of the stations at which said gripping means grasps a workpiece, said activating means being effective to cause inactivation after said gripping means has grasped the workpiece.

13. The apparatus according to claim 3 including means to cause said gripping means to simultaneously grasp the workpieces and to simultaneously release the workpieces.

14. The apparatus according to claim 1 in which said ante chamber has a volume of approximately one one-hundredth of the volume of the chamber.

15. The apparatus according to claim 14 in which said vacuum producing means produces a vacuum of at least four orders of magnitude less than the vacuum in the chamber.

16. The apparatus according to claim 1 in which said vertically movable means supports said sealing means that seals the chamber from the opening when said vertically movable means is in its first position.

17. The apparatus according to claim 1 in which said ante chamber has a volume of no greater than one-fiftieth of the volume of the chamber.

18. An apparatus for transferring a workpiece into and out of a vacuum chamber through an opening in a wall of the vacuum chamber without affecting the vacuum level in the vacuum chamber including:

vertically movable means disposed within the vacuum chamber;

means to vacuum seal the vacuum chamber from the opening in the wall of the vacuum chamber when said vertically movable means is in a first position, said vertically movable means being disposed to receive workpieces from and deliver workpieces to exterior of the vacuum chamber when in its first position;

movable means to vacuum seal the opening in the wall of the vacuum chamber from the atmosphere when said vertically movable means is removed from its first position;

said movable means and said vertically movable means cooperating to form an ante chamber therebetween when said vertically movable means is in its first position and said movable means is vacuum sealing the opening in the wall of the vacuum chamber;

means to produce a vacuum in the ante chamber after said vertically movable means receives a workpiece from exterior of the vacuum chamber and before said vertically movable means is moved from its first position to a second position in which said vertically movable means is not vacuum sealing the opening in the wall of the vacuum chamber, said vacuum producing means producing a vacuum of at least one order of magnitude less than the vacuum in the vacuum chamber and related to the ratio of the volume of the ante chamber to the volume of the vacuum chamber so that the vacuum level in the vacuum chamber is not affected by said vertically movable means moving from its first position to produce communication of said ante chamber with the vacuum chamber; and means to produce substantially atmospheric pressure in said ante chamber after said vertically movable means has moved from its second position to its first position to again form said ante chamber and prior to movement of said movable means to break the vacuum seal between the atmosphere and said ante chamber.

19. The apparatus according to claim 18 in which said ante chamber has a volume of approximately one one-hundredth of the volume of the vacuum chamber.

20. The apparatus according to claim 19 in which said vacuum producing means produces a vacuum of at least four orders of magnitude less than the vacuum in the vacuum chamber.

21. The apparatus according to claim 18 including means to transfer a workpiece on said vertically movable means from said vertically movable means to a work station when said vertically movable means is in its second position.

22. The apparatus according to claim 18 in which said vertically movable means supports said sealing means that seals the vacuum chamber from the opening when said vertically movable means is in its first position.

23. The apparatus according to claim 18 in which said ante chamber has a volume of no greater than one-fiftieth of the volume of the vacuum chamber.

24. The apparatus according to claim 21 in which said vertically movable means comprises a first station when in its second position and the work station comprises a second station, said workpiece transfer means including:

a rotary arm;

said arm having workpiece gripping means disposed 180° from each other;

index means to rotate said arm 180° during each activation to always position each of said gripping means at one of the stations;

and each of said gripping means having means responsive to the station at which it is located to cause one of said gripping means to grasp one of the workpieces at only the first station and to release the grasped workpiece at only the second station and to cause the other of said gripping means to grasp one of the workpieces at only the second station and to release the grasped workpiece at only the first station.

25. The apparatus according to claim 24 in which each of said gripping means includes:

a body slidably mounted on said arm;

moving means to extend and retract said body along said arm when said arm is positioned so that said gripping means can cooperate with a workpiece support position at each of the first and second stations;

and means mounted on said body for grasping a workpiece at one of the first and second stations for transfer of the workpiece to the other of the first and second stations when said arm is rotated 180° by said index means, said mounted means releasing the workpiece at the other of the first and second work stations.

26. The apparatus according to claim 25 in which:

said mounted means of each of said gripping means includes:

a pair of cooperating grippers mounted on said body for movement toward and away from each other;

and means continuously urging said grippers to the position in which said grippers grasp a workpiece;

and said responsive means includes:

first means to enable said urging means of said one gripping means to be effective to cause said grippers of said one gripping means to grasp the workpiece only at the first station;

and second means to enable said urging means of said other gripping means to be effective to cause said grippers of said other gripping means to grasp the workpiece only at the second station.

27. The apparatus according to claim 26 in which each of said first and second means of said responsive means enables said urging means of each of said gripping means to be effective to cause said grippers to grasp a workpiece in response to movement of said moving means in the direction in which said body is retracted when said gripping means is at the station at which said gripping means grasps a workpiece.

28. The apparatus according to claim 27 including:

means cooperating with said grippers of each of said gripping means to move said grippers to a non-grasping position when said moving means is moved in the direction in which said body is extended after movement of said body by said moving means has been completed;

and each of said first and second means of said responsive means including means to hold said grippers in a non-grasping position after said grippers have been moved to this position by said cooperating means when said gripping means is at the station at which said gripping means releases a workpiece.

29. The apparatus according to claim 28 in which:

each of said gripping means includes means to activate means at each of the stations to retain a workpiece when said gripping means is at the station at which said gripping means releases a workpiece, said activating means at each of the stations being effective after the workpiece has been disposed at the workpiece support position;

and each of said activating means inactivating the workpiece retaining means at the other of the stations at which said gripping means grasps a workpiece, said activating means being effective to cause inactivation after said gripping means has grasped the workpiece.

30. The apparatus according to claim 29 in which said moving means includes means to cause simultaneous extension and retraction of said bodies of said gripping means.

31. The apparatus according to claim 25 in which said moving means includes means to cause simultaneous extension and retraction of said bodies of said gripping means.

32. The apparatus according to claim 24 in which each of said responsive means has means cooperating with means disposed at each of the first and second stations to determine whether said responsive means causes grasping or releasing of the workpiece by said gripping means.

33. The apparatus according to claim 24 in which:

each of said gripping means includes means to activate means at each of the stations to retain a workpiece when said gripping means is at the station at which said gripping means releases a workpiece, said activating means at each of the stations being effective after the workpiece has been disposed at a workpiece support position;

and each of said activating means inactivating the workpiece retaining means at the other of the stations at which said gripping means grasps a workpiece, said activating means being effective to cause inactivation after said gripping means has grasped the workpiece.

34. The apparatus according to claim 24 including means to cause said gripping means to simultaneously grasp the workpieces and to simultaneously release the workpieces.

35. A method of transferring workpieces into and out of a vacuum chamber through an opening in a wall of the vacuum chamber without affecting the vacuum level in the vacuum chamber including:

disposing vertically movable means at a position within the vacuum chamber adjacent the opening in the wall of the vacuum chamber so that a workpiece can be received by the vertically movable means from exterior of the vacuum chamber while the vacuum chamber is vacuum sealed from the opening in the wall of the vacuum chamber due to the position of the vertically movable means;

disposing a cover on the exterior of the vacuum chamber over the opening in the wall of the vacuum chamber to vacuum seal the opening from the atmosphere;

producing a partial vacuum of at least one order of magnitude less than that in the vacuum chamber within an ante chamber formed by the cover and the vertically movable means when the cover and the vertically movable means are vacuum sealing the opening in the wall of the vacuum chamber;

moving the vertically movable means into the vacuum chamber to move the workpiece thereon to a transfer position within the vacuum chamber after the partial vacuum has been produced in the ante chamber;

transferring the workpiece from the vertically movable means to a work position within the vacuum chamber after completion of movement of the vertically movable means;

returning the vertically movable means to its position adjacent the opening in the wall of the vacuum chamber after it has received a workpiece from the work position to again form the ante chamber;

producing substantially atmospheric pressure in the ante chamber;

removing the cover from its sealing position after the ante chamber is at substantially atmospheric pressure to allow the workpiece on the vertically movable means to communicate exterior of the vacuum chamber; and removing the workpiece from the vertically movable means to exterior of the vacuum chamber and disposing another workpiece on the vertically movable means from exterior of the vacuum chamber.

36. The method according to claim 35 including simultaneously transferring a workpiece from the work position to the vertically movable means during transfer of a workpiece from the vertically movable means to the work position.

* * * * *